US012575136B2

(12) United States Patent
Kim et al.

(10) Patent No.: US 12,575,136 B2
(45) Date of Patent: Mar. 10, 2026

(54) TRANSISTOR

(71) Applicant: Samsung Electronics Co., Ltd.,
Suwon-si (KR)

(72) Inventors: Sangwook Kim, Suwon-si (KR);
Kyung-Eun Byun, Suwon-si (KR);
Keunwook Shin, Suwon-si (KR);
Moonil Jung, Suwon-si (KR); **Euntae
Kim, Suwon-si (KR); Jeeeun Yang,**
Suwon-si (KR); Kwanghee Lee,
Suwon-si (KR)

(73) Assignee: Samsung Electronics Co., Ltd.,
Gyeonggi-Do (KR)

( * ) Notice: Subject to any disclaimer, the term of this
patent is extended or adjusted under 35
U.S.C. 154(b) by 498 days.

(21) Appl. No.: 18/158,176

(22) Filed: Jan. 23, 2023

(65) Prior Publication Data

US 2023/0238460 A1 Jul. 27, 2023

(30) Foreign Application Priority Data

Jan. 27, 2022 (KR) ........................ 10-2022-0012580

(51) Int. Cl.
*H10D 30/67* (2025.01)
*H10D 62/80* (2025.01)
(52) U.S. Cl.
CPC ..... *H10D 30/6755* (2025.01); *H10D 30/6729*
(2025.01); *H10D 62/882* (2025.01)
(58) Field of Classification Search
CPC . H10D 64/667; H10D 64/669; H01L 21/2807
See application file for complete search history.

(56) References Cited

U.S. PATENT DOCUMENTS

| | | | |
|---|---|---|---|
| 8,410,838 B2 | 4/2013 | Kato et al. | |
| 8,559,220 B2 | 10/2013 | Yamazaki et al. | |
| 8,883,556 B2 | 11/2014 | Yamazaki | |
| 9,177,872 B2 | 11/2015 | Sandhu | |
| 9,306,021 B2 * | 4/2016 | Chung ................. | B82Y 10/00 |
| 9,431,441 B1 | 8/2016 | Zhou et al. | |
| 9,564,217 B1 | 2/2017 | Zhou et al. | |
| 9,647,120 B1 * | 5/2017 | Bi ........................ | H10D 62/117 |

(Continued)

FOREIGN PATENT DOCUMENTS

| | | |
|---|---|---|
| KR | 10-2012-0062376 A | 6/2012 |
| KR | 10-2019-0053338 A | 5/2019 |

(Continued)

OTHER PUBLICATIONS

Extended European Search Report dated Jul. 7, 2023 issued in
European Patent Application No. 23153062.7-1020.

(Continued)

*Primary Examiner* — Vincent Wall
(74) *Attorney, Agent, or Firm* — Harness, Dickey &
Pierce, P.L.C.

(57) ABSTRACT

A transistor includes an oxide semiconductor layer, a source
electrode and a drain electrode disposed spaced apart from
each other on the oxide semiconductor layer, a gate electrode
spaced apart from the oxide semiconductor layer, a gate
insulating layer disposed between the oxide semiconductor
layer and the gate electrode, and a graphene layer disposed
between the gate electrode and the gate insulating layer and
doped with a metal.

20 Claims, 11 Drawing Sheets

(56) References Cited

U.S. PATENT DOCUMENTS

| | | | |
|---|---|---|---|
| 9,711,549 B2 | 7/2017 | Yamazaki et al. | |
| 9,812,604 B2 | 11/2017 | Hsu | |
| 10,192,913 B2 | 1/2019 | Kurokawa | |
| 10,236,033 B2 | 3/2019 | Koyama et al. | |
| 10,347,637 B2 | 7/2019 | Sandhu | |
| 10,522,693 B2 | 12/2019 | Kurokawa | |
| 10,734,378 B2 | 8/2020 | Morris et al. | |
| 2009/0020764 A1* | 1/2009 | Anderson | H10D 30/024 |
| | | | 257/77 |
| 2012/0326129 A1* | 12/2012 | Lin | B82Y 10/00 |
| | | | 257/29 |
| 2013/0069052 A1 | 3/2013 | Sandhu | |
| 2017/0057827 A1* | 3/2017 | Sultana | G02B 26/04 |
| 2017/0229587 A1* | 8/2017 | Lee | H10D 30/6757 |
| 2020/0002501 A1 | 1/2020 | Yun et al. | |
| 2020/0020756 A1 | 1/2020 | Ueda et al. | |
| 2020/0044095 A1 | 2/2020 | Wang et al. | |
| 2020/0091156 A1 | 3/2020 | Sharma et al. | |
| 2020/0091306 A1* | 3/2020 | Heo | H10D 64/689 |
| 2020/0203494 A1 | 6/2020 | Liu | |
| 2020/0227519 A1 | 7/2020 | Song et al. | |
| 2020/0411078 A1 | 12/2020 | Sharma | |
| 2021/0367080 A1 | 11/2021 | Lee et al. | |
| 2023/0238460 A1* | 7/2023 | Kim | H10D 64/689 |
| | | | 257/288 |
| 2024/0014315 A1* | 1/2024 | Shin | H10D 64/667 |
| 2024/0079468 A1* | 3/2024 | Jung | H10D 30/6755 |
| 2024/0222515 A1* | 7/2024 | Yang | H10D 30/6757 |

FOREIGN PATENT DOCUMENTS

| | | |
|---|---|---|
| KR | 10-2059131 B1 | 12/2019 |
| KR | 10-2020-0002700 A | 1/2020 |

OTHER PUBLICATIONS

S. Subhechha et al., "First demonstration of sub-12 nm LG gate last IGZO-TFTs with oxygen tunnel architecture for front gate devices," Symposium on VLSI Technology pp. 1-2 (2021).

S.M. Song et al, "Work function tuning of metal/graphene stack electrode", Applied Physics Letters, 2014.

Office Action from corresponding Korean Application No. 10-2022-0012580, dated Nov. 28, 2025.

\* cited by examiner

FIG. 2

| Material | Work function (eV) |
|---|---|
| TiN, W | 4.3~4.65 |
| Graphene | 4.5~4.65 |
| As, P doped graphene | 4.7~4.8 |
| Ru-doped graphene | 4.9~5.1 |

TRANSISTOR

CROSS-REFERENCE TO RELATED APPLICATION

This application is based on and claims priority under 35 U.S.C. § 119 to Korean Patent Application No. 10-2022-0012580, filed on Jan. 27, 2022, in the Korean Intellectual Property Office, the disclosure of which is incorporated by reference herein in its entirety.

BACKGROUND

Various example embodiments relates to transistors including an oxide semiconductor layer.

Oxide semiconductor devices including a transparent semiconductor material having a wide bandgap of 3.0 eV or greater have been studied for many years. The oxide semiconductor devices are mass-produced as driving devices for large-area OLED TVs.

As the degree of device integration of semiconductor devices increases, the devices are required or desired to be smaller. In the case of a transistor, as a size thereof is reduced, a channel length may decrease. A decrease in the channel length of the transistor may cause or may exacerbate a short channel effect that results in a shift of a threshold voltage.

SUMMARY

Provided are transistors having improved operation reliability.

However, problems to be solved are not limited to the above disclosure.

Additional aspects will be set forth in part in the description which follows and, in part, will be apparent from the description, and/or may be learned by practice of various example embodiments.

According to various example embodiments, a transistor includes an oxide semiconductor layer; a source electrode and a drain electrode on the oxide semiconductor layer and spaced apart from each other; a gate electrode spaced apart from the oxide semiconductor layer; a gate insulating layer between the oxide semiconductor layer and the gate electrode; and a graphene layer between the gate electrode and the gate insulating layer and doped with a metal.

The metal doped in the graphene layer may be different from a metal included in the oxide semiconductor layer.

The metal doped into the graphene layer may include at least one of ruthenium (Ru), aluminum (Al), titanium (Ti), thallium (Tl), platinum (Pt), tantalum (Ta), rhodium (Rh), iridium (Ir), cobalt (Co), and tungsten (W).

The metal may be doped in an amount of 0.2 at % or more and 5 at % or less with respect to a total amount of the graphene layer.

A work function of the graphene layer may be 4.9 eV or more and 5.1 eV or less.

A threshold voltage of the transistor may be a positive value when a current flowing from the drain electrode to the source electrode is $10^{-12}$ A/micron.

A thickness of the graphene layer may be less than a thickness of the gate electrode.

The thickness of the graphene layer may be 10 nm or less.

The oxide semiconductor layer may include at least one of In, Zn, Sn, Ga, and Hf.

The graphene layer may be in contact with two or more surfaces of the gate electrode.

The graphene layer may be in contact with a lower surface of the gate electrode and a side surface of the gate electrode.

The gate insulating layer may at least partially cover two or more surfaces of the gate electrode.

The gate insulating layer may at least partially cover a lower surface of the gate electrode and a side surface of the gate electrode.

The gate insulating layer may be in contact with at least one of the source electrode and the drain electrode.

At least one of the source electrode and the drain electrode may include a stepped shape.

At least one of the source electrode and the drain electrode may include a first region having a first thickness and a second region having a second thickness less than the first thickness, wherein the second region may be closer to the gate electrode than the first region.

The source electrode, the drain electrode, and the gate insulating layer may be on a same surface of the oxide semiconductor layer.

The source electrode and the drain electrode may be on a first surface of the oxide semiconductor layer, and the gate insulating layer may be on a second surface, different from the first surface of the oxide semiconductor layer.

The gate insulating layer may include a first gate insulating layer in contact with a first surface of the oxide semiconductor layer and a second gate insulating layer in contact with a second surface, different from the first surface of the oxide semiconductor layer. The gate electrode may include a first gate electrode on the first gate insulating layer and a second gate electrode on the second gate insulating layer. The graphene layer may include a first graphene layer between the first gate insulating layer and the first gate electrodes and a second graphene layer between the second gate insulating layer and the second gate electrode.

The source electrode, the oxide semiconductor layer, and the drain electrode may be sequentially arranged in one direction.

The gate insulating layer may entirely surround a side surface of the oxide semiconductor layer.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 shows results of measuring a work function of a material according to various example embodiments;

DETAILED DESCRIPTION

Figure 1:
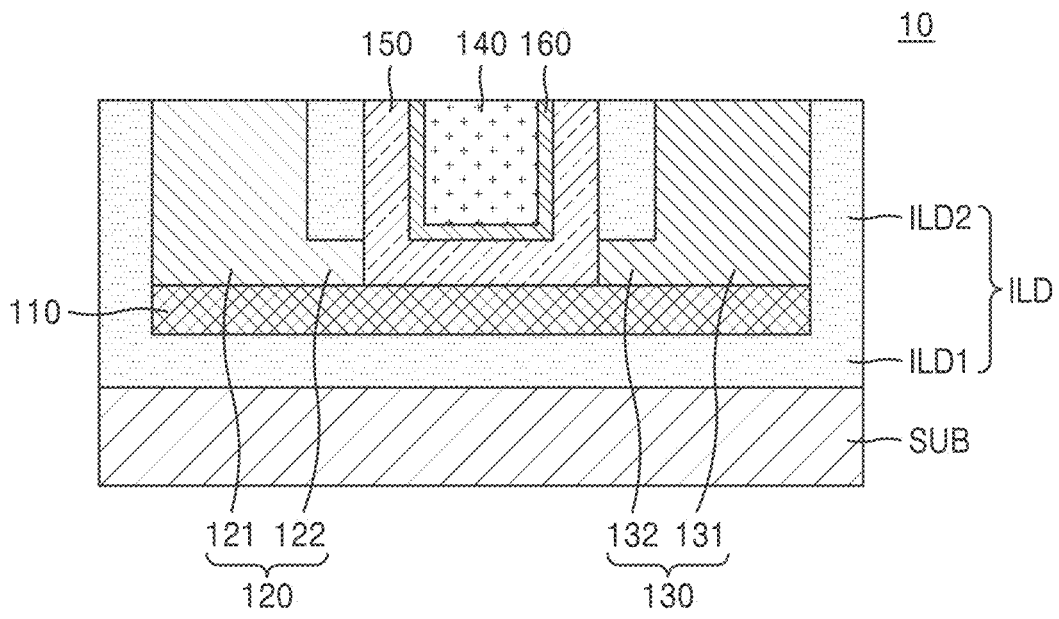
FIG. 1 is a diagram illustrating a transistor according to various example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Example embodiments are described in detail with reference to the accompanying drawings. In the following drawings, like reference numerals refer to like components, and the size of each component in the drawings may be exaggerated for clarity and convenience of description. The embodiments described herein are merely examples, and various modifications may be made from these embodiments.

When it is described that a certain component is "above" or "on" another component, the certain component may be directly above another component, or a third component may be interposed therebetween. The singular expressions include plural expressions unless the context clearly dictates otherwise. When a part "includes" a component, it may indicate that the part does not exclude another component but may further include another component, unless otherwise stated. The use of the terms "a" and "an" and "the" and similar referents may cover both the singular and the plural.

FIG. 1 is a diagram illustrating a transistor 10 according to various example embodiments. Referring to FIG. 1, the transistor 10 may be disposed on or in a substrate SUB. The transistor 10 may include an oxide semiconductor layer 110, a source electrode 120 and a drain electrode 130 disposed on the oxide semiconductor layer 110 and spaced apart from each other, a gate electrode 140 disposed to be spaced apart from the oxide semiconductor layer 110, and a gate insulating layer 150 disposed between the oxide semiconductor layer 110 and the gate electrode 140.

The substrate SUB may be provided in a flat plate shape extending along one surface thereof. The substrate SUB may include a material for forming a device, and a material having good or excellent mechanical strength and/or dimensional stability may be selected. The material of the substrate SUB may include, but is not limited to, a glass plate, a metal plate, a ceramic plate, or plastic (a polycarbonate resin, a polyester resin, an epoxy resin, a silicone resin, a fluorine resin, etc.).

A first interlayer insulating layer (e.g., a first interlayer dielectric (ILD1)) may be disposed on the substrate SUB. The oxide semiconductor layer 110 may be disposed on the first interlayer insulating layer ILD1. As an example, the oxide semiconductor layer 110 may be provided in the form of an ultra-thin film. For example, a thickness of the oxide semiconductor layer 110 may be 30 nm or less. The oxide semiconductor layer 110 according to an example may include metal elements of group 12, 13 and 14 such as zinc (Zn), indium (In), gallium (Ga), tin (Sn), cadmium (Cd), germanium (Ge), or hafnium (Hf), and oxides of materials selected from one or combinations thereof. For example, the oxide semiconductor layer 110 may be formed of a Zn oxide-based material, such as one or more of Zn oxide, In—Zn oxide, Ga—In—Zn oxide, or the like. As an example, the oxide semiconductor layer 110 may be provided as a single-layer or as a multi-layer structure.

The source electrode 120 and the drain electrode 130 may be disposed on the oxide semiconductor layer 110 and spaced apart from each other. The source electrode 120 and the drain electrode 130 may be disposed on the same surface of the oxide semiconductor layer 110. The source electrode 120 and the drain electrode 130 may include an electrically conductive material. For example, the source electrode 120 and the drain electrode 130 may include a metal and/or a metal compound, and may include the same, or different materials.

The gate electrode 140 may be disposed between the source electrode 120 and the drain electrode 130 on the oxide semiconductor layer 110. The gate electrode 140, the source electrode 120, and the drain electrode 130 may be disposed on the same surface of the oxide semiconductor layer 110. According to some example embodiments, the gate electrode 140 may include an electrically conductive material. For example, the gate electrode 140 may include a metal and/or a metal compound.

The gate insulating layer 150 may be disposed between the oxide semiconductor layer 110 and the gate electrode 140 to electrically disconnect the oxide semiconductor layer 110 and the gate electrode 140. For example, the gate insulating layer 150 may include a ferroelectric material. As an example, the ferroelectric material may include at least one of an oxide ferroelectric material, a polymer ferroelectric material, a fluoride ferroelectric material such as BaMgF4 (BMF), and/or a ferroelectric material semiconductor.

The transistor 10 including the oxide semiconductor layer 110 has a wide bandgap of 3.0 eV or greater. In addition, the transistor 10 including the oxide semiconductor layer 110 may reduce an OFF-current, have a low subthreshold swing (SS), and/or have a high ON/OFF ratio.

When such a transistor 10 is applied as a driving element of an electronic device, for example, a display device, a short-channel effect due to scaling down may exist or be pronounced, varying performance. Typically, a length of the transistor 10 may be reduced, so it may be difficult to control a threshold voltage. In general, in the process of forming other components of the transistor 10 after the oxide semiconductor layer 110 is formed, a conductivity of the oxide semiconductor layer 110 may increase due to the influence of a process such as plasma damage and/or an increase in the hydrogen (H) concentration. As a result, a threshold voltage of the transistor 10 may be reduced. Alternatively or additionally, when the transistor 10 is driven in a high temperature, high voltage state, the threshold voltage may be shifted to a negative value due to migration of hydrogen.

The transistor 10 according to various example embodiments may further include a graphene layer 160 doped with, and/or having incorporated therein, a metal between the gate insulating layer 150 and the gate electrode 140. The metal may be interstitially within the graphene, and/or may be substitutional within the graphene; example embodiments are not limited thereto.

The metal doped in the graphene layer 160 may be different from a metal included in the oxide semiconductor layer 110. For example, the metal doped in the graphene layer 160 may include at least one of ruthenium (Ru), aluminum (Al), titanium (Ti), thallium (Tl), platinum (Pt), tantalum (Ta), rhodium (Rh), iridium (Ir), cobalt (Co), and tungsten (W). The metal may be doped in an amount of about 0.2 at % or more, 0.5 at % or more, 2 at % or more, 3 at % or more, 4 at % or less, or 5 at % or less with respect to a total amount of the metal-doped graphene layer 160 A thickness of the graphene layer 160 may be less than a thickness of the gate electrode 140. The thickness of the graphene layer 160 may be about 10 nm or less.

The metal-doped graphene layer 160 may increase a work function to increase the threshold voltage of the transistor 10. An ideal threshold voltage $V_T$ of the transistor 10 may be expressed as in Equation 1 below.

$$V_T = \Phi_{ms} - \frac{Q_i}{C_i} - \frac{Q_d}{C_i} + 2\phi_F \qquad \text{[Equation 1]}$$

Here, $\Phi_{ms}=\Phi_m-\Phi_s$ represents a difference between a work function Om of the gate electrode 140 and a work function $\Phi_s$ of the oxide semiconductor layer 110, Ci represents capacitance of the gate insulating layer 150, Qi represents the amount of charges in the gate insulating layer 150, Qd represents the amount of deflation charges in the gate insulating layer 150, and $\Phi_f$ represents a Fermi level of the oxide semiconductor layer 110.

According to Equation 1, in general, the threshold voltage $V_T$ of the transistor 10 may increase when Ci is large, for example, when one or more of the gate insulating layer 150 is high-k, the thickness of the gate insulating layer 150 is small, or the work function of the gate electrode 140 is large.

In general, W or TiN may be used for the gate electrode 140. A work function of W or TiN may be about 4.3 to 4.65 eV. Meanwhile, an undoped graphene layer may have a work function of about 4.65 eV, which is greater than that of a metal. If the graphene layer is doped with or has incorporated therein a metal, the grapheme layer may have a higher work function. For example, a graphene layer doped with Ru has a work function of 4.9 to 5.1 eV, and thus may have a higher work function of about 0.5 eV than a gate electrode including a metal material. Therefore, when the metal-doped graphene layer 160 having a high work function is disposed between the gate insulating layer 150 and the gate electrode 140, the metal-doped graphene layer 160 may serve as the gate electrode 140, thereby increasing the threshold voltage of the transistor 10.

Alternatively or additionally, the graphene layer 160 may prevent or reduce the amount of or impact from material diffusion between the layers. Hydrogen is a dopant of an oxide semiconductor, and when the content of hydrogen in the oxide semiconductor layer 110 increases, the threshold voltage of the oxide semiconductor layer 110 decreases. During a thin film deposition and/or a heat treatment process of the transistor 10, hydrogen may be introduced into the oxide semiconductor layer 110, and during high-temperature driving of the transistor 10, hydrogen may be introduced into the oxide semiconductor layer 110 due to bias stress. The introduced hydrogen lowers the threshold voltage of the oxide semiconductor layer 110. For example, in order to increase thermal stability and reliability of device driving, it is necessary or desirable to prevent or reduce hydrogen from diffusing into the oxide semiconductor layer 110. Because carbon atoms of graphene have a small bonding length and are bound by strong covalent bonds, the carbon atoms may act as a diffusion barrier that effectively prevents or reduces material diffusion. Accordingly, by forming the graphene layer 160 on the gate insulating layer 150, hydrogen diffusing from the gate electrode 140 may be or at least partially be properly blocked, thereby improving the reliability of the threshold voltage control.

For example, the metal-doped transistor 10 according to various example embodiments has a large work function, so that the metal-doped transistor 10 may serve as a barrier to prevent or reduce material diffusion, while serving as the gate electrode 140, thereby improving the reliability of driving of the transistor.

The metal-doped graphene layer 160 may be in contact with two or more surfaces of the gate electrode 140. For example, the metal-doped graphene layer 160 may be in contact with a lower surface and side surfaces of the gate electrode 140. The metal-doped graphene layer 160 may effectively prevent or reduce the material of the gate electrode 140 from diffusing to the outside.

The gate insulating layer 150 may also cover two or more surfaces of the gate electrode 140. For example, the gate insulating layer 150 may be disposed on the lower surface and side surfaces of the gate electrode 140. The gate insulating layer 150 may insulate the gate electrode 140 from the oxide semiconductor layer 110 as well as insulate the gate electrode 140, the source electrode 120, and the drain electrode 130. Thus, a length or a channel length of the oxide semiconductor layer 110 may be reduced.

The source electrode 120 and the drain electrode 130 may include a stepped shape. For example, the source electrode 120 may include a first source electrode 121 having a first thickness and a second source electrode 122 having a second thickness less than the first thickness, and the second source electrode 122 may be disposed closer to the gate electrode 140 than the first source electrode 121. The source electrode 120 having a stepped shape may reduce formation of parasitic capacitance between the gate electrode 140 and the source electrode 120, while securing or helping to secure a contact area with the oxide semiconductor layer 110.

The drain electrode 130 may have a symmetrical structure with the source electrode 120 with respect to the gate electrode 140. For example, the drain electrode 130 may include a first drain electrode 131 having a first thickness and a second drain electrode 132 having a second thickness less than the first thickness, and the second drain electrode 132 may be disposed closer to the gate electrode 140 than the first drain electrode 130. The drain electrode 130 having a stepped shape may reduce formation of a parasitic capacitance between the gate electrode 140 and the source electrode 120, while securing a contact area with the oxide semiconductor layer 110.

Alternatively or additionally, at least one of the source electrode 120 and the drain electrode 130 may be in contact with even the gate insulating layer 150. Thus, the transistor 10 may be integrated, while reducing the length of the oxide semiconductor layer 110.

A second interlayer insulating layer ILD2 may fill a gap between the gate insulating layer 150 and the source electrode 120 and between the gate insulating layer 150 and the drain electrode 130. The second interlayer insulating layer ILD2 may electrically disconnect the oxide semiconductor layer 110, the gate electrode 140, the source electrode 120, and the drain electrode 130 from each other. As an example, the second interlayer insulating layer ILD2 may be in contact with the first interlayer insulating layer ILD1, and bury the oxide semiconductor layer 110, the gate insulating layer 150, the gate electrode 140, the source electrode 120, and the drain electrode 130.

FIG. 2 is results of measuring a work function of each material according to various example embodiments. Referring to FIG. 2, a work function of a material including TiN and W was about 4.3 eV or more and 4.65 eV or less, and a work function of graphene was about 4.5 eV or more and 4.65 eV or less. A work function of the graphene layer doped with a metalloid (e.g., As) and a non-metal (e.g., P) was about 4.7 eV or more and 4.8 eV or less. A work function of a graphene layer doped with a metal, for example, Ru, was about 4.9 eV or more and 5.1 eV or less.

When a graphene layer is added to the gate electrode, it may be expected that the work function increases. In particular, when a metal-doped graphene layer is added to the gate electrode, it may be expected that a work function exceeds 4.8 eV. A work function of the metal-doped graphene layer according to various example embodiments may be 4.8 eV or more and 5.3 eV or less. Alternatively, a work function of the metal-doped graphene layer according to various example embodiments is 4.9 eV or more and 5.1 eV or less.

Figure 3:
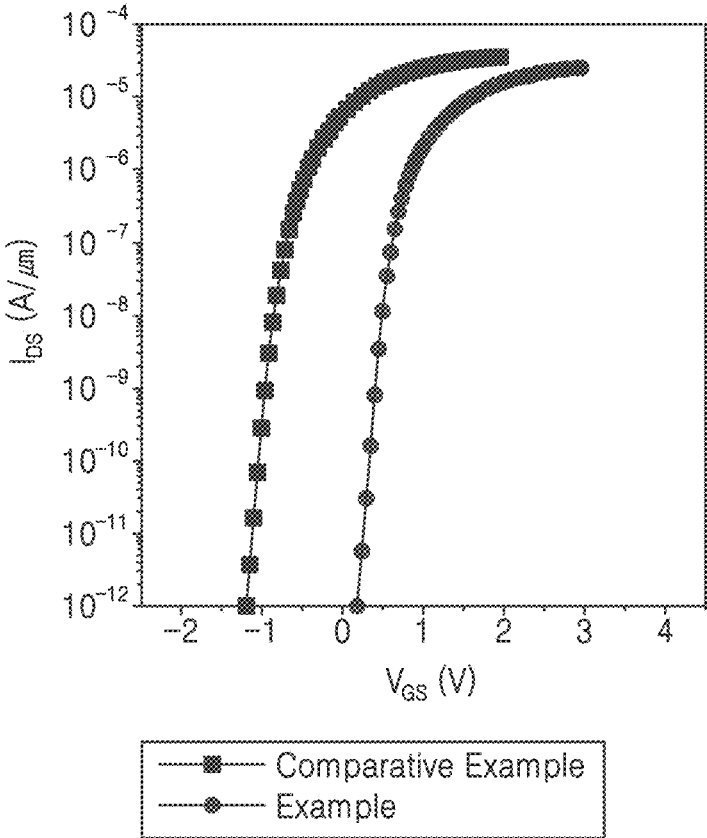
FIG. 3 shows results of measuring IV characteristics of a transistor according to various example embodiments.

FIG. 3 is results of measuring current-voltage (IV) characteristics of the transistor 10 according to various example embodiments. Example is IV characteristics of a transistor including a metal-doped graphene layer, and Comparative Example is IV characteristics of a transistor not including a metal-doped graphene layer. It can be seen that, when a current IDS flowing from the drain electrode 130 to the source electrode 120 is $10^{-12}$ A/□m or $10^{-12}$ A/micron, a threshold voltage of Example is a positive voltage, whereas a threshold voltage of Comparative Example is a negative voltage. Therefore, it can be seen that the threshold voltage may be maintained at a positive value even when the drain current is $10^{-12}$ A/□m by adding the metal-doped graphene layer 160 to the gate electrode 140.

The metal-doped graphene layer may be applied to various types of transistors.

Figure 4:
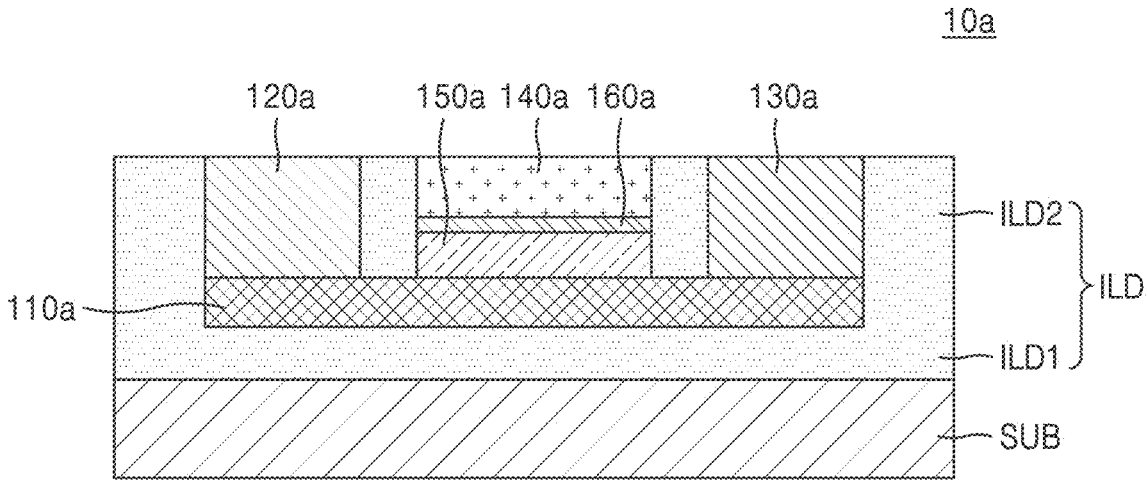
FIG. 4 is a diagram illustrating a transistor having a top gate structure according to another embodiment.

FIG. 4 is a diagram illustrating a transistor 10a having a top gate structure according to various example embodiments. Comparing FIG. 4 with FIG. 1, a source electrode 120a and a drain electrode 130a of the transistor 10a of FIG. 4 disposed to be spaced apart from each other on an oxide semiconductor layer 110a. In addition, a gate insulating layer 150a, a metal-doped graphene layer 160a, and a gate electrode 140a may be sequentially stacked on the oxide semiconductor layer 110a. The metal-doped graphene layer 160a may be disposed only on a lower surface of the gate electrode 140a, and the source electrode 120a and the drain electrode 130a may be disposed to be spaced apart from the gate insulating layer 150a. A length (e.g., a channel length) of the oxide semiconductor layer 110a of the transistor 10a of FIG. 4 may be longer than that of the transistor 10 of FIG. 1.

A metal doped in the graphene layer 160a may be different from a metal included in the oxide semiconductor layer 110a. For example, the metal doped into the graphene layer 160a may include at least one of ruthenium (Ru), aluminum (Al), titanium (Ti), thallium (TI), platinum (Pt), tantalum (Ta), rhodium (Rh), iridium (Ir), cobalt (Co), and tungsten (W), and the oxide semiconductor layer 110a may be an oxide including at least one of In, Zn, Sn, Ga, and Hf. The metal may be doped in an amount of 0.2 at % or more, 0.5 at % or more, 2 at % or more, 3 at % or more, 4 at % or less, or 5 at % or less with respect to a total amount of the graphene layer 160a, and a thickness of the doped graphene layer 160a is less than a thickness of the gate electrode 140a. For example, the thickness of the graphene layer 160a may be about 10 nm or less.

Figure 5:
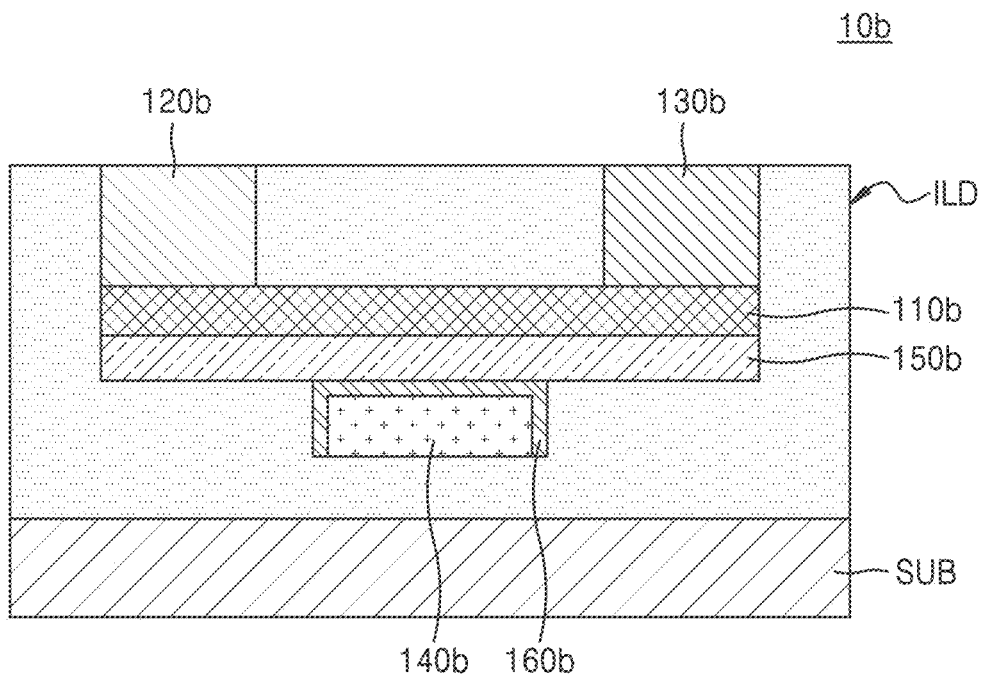
FIG. 5 is a diagram illustrating a transistor having a bottom gate structure according to various example embodiments.

FIG. 5 is a diagram illustrating a transistor 10b having a bottom gate structure according to various example embodiments. Comparing FIG. 5 with FIG. 2, a source electrode 120b and a drain electrode 130b of the transistor 10b of FIG. 5 may be disposed to be spaced apart from each other on an upper surface of an oxide semiconductor layer 110b, and a gate electrode 140b may be disposed on a lower surface of the oxide semiconductor layer 110b. A gate insulating layer 150b may be disposed between the oxide semiconductor layer 110b and the gate electrode 140b. A metal-doped graphene layer 160b may be disposed between the gate insulating layer 150b and the gate electrode 140b. The metal-doped graphene layer 160b may also be disposed on a side surface of the gate electrode 140b, as well as between the gate insulating layer 150b and the gate electrode 140b. Characteristics of each component have been described above, and thus, a detailed description thereof is omitted.

Figure 6:
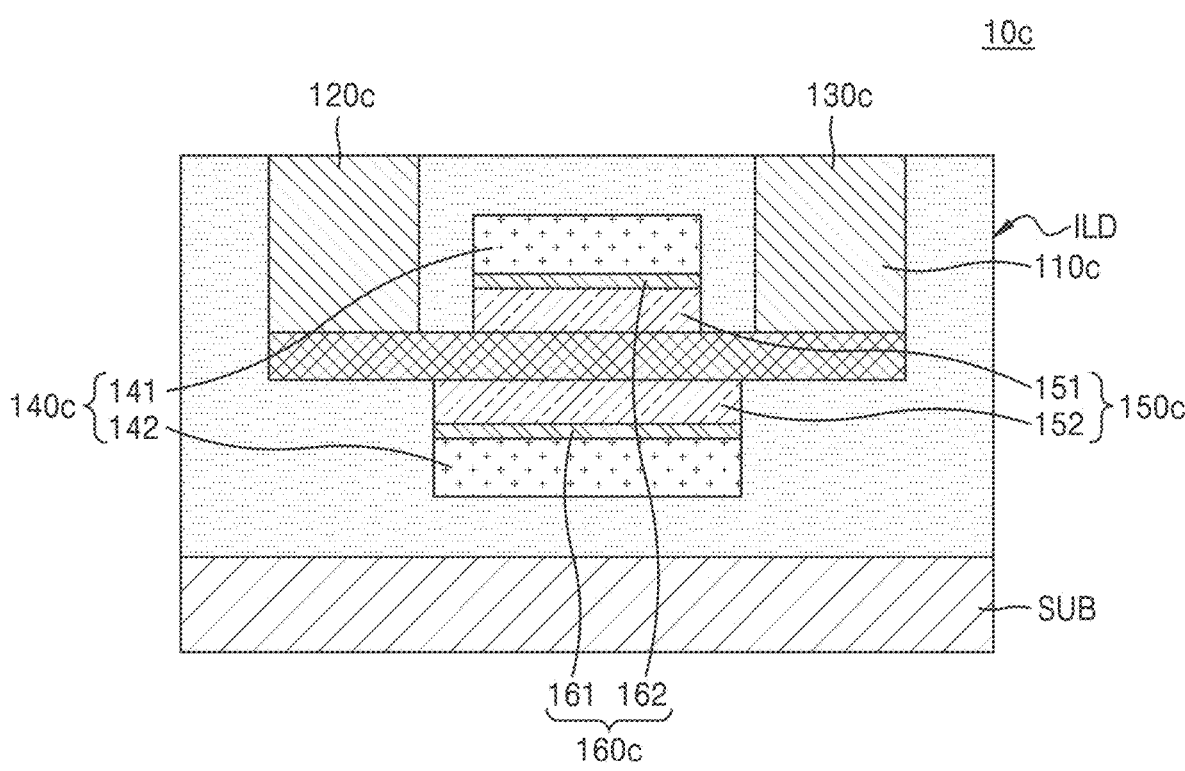
FIG. 6 is a diagram illustrating a transistor having a double gate structure according to various example embodiments.

FIG. 6 is a diagram illustrating a transistor 10c having a double gate structure according to various example embodiments. Comparing FIG. 6 with FIG. 2, a gate insulating layer 150c may include a first gate insulating layer 151 disposed on an upper surface of an oxide semiconductor layer 110c and a second gate insulating layer 152 disposed on a lower surface of the oxide semiconductor layer 110. A gate electrode 140c may include a first gate electrode 141 disposed on an upper surface of the first gate insulating layer 151 and a second gate electrode 142 disposed on a lower surface of the second gate insulating layer 152. In addition, a graphene layer 160c may include a first graphene layer 161 disposed between the first gate insulating layer 151 and the first gate electrode 142 and a second graphene layer 162 disposed between the second gate insulating layer 152 and the second gate electrode 142. The first and second graphene layers 161 and 162 may be doped with a metal.

The metal doped in the graphene layer 160c may be different from a metal included in the oxide semiconductor layer 110c. For example, the metal doped in the graphene layer 160c may include at least one of ruthenium (Ru), aluminum (Al), titanium (Ti), thallium (Ti), platinum (Pt), tantalum (Ta), rhodium (Rh), iridium (Ir), cobalt (Co), and tungsten (W), and the oxide semiconductor layer 110c may be an oxide including at least one of In, Zn, Sn, Ga, and Hf. The metal may be doped in an amount of 0.2 at % or more, 0.5 at % or more, 2 at % or more, 3 at % or more, 4 at % or less, or 5 at % or less with respect to a total amount of the graphene layer 160c, and a thickness of the metal-doped graphene layer 160c is less than a thickness of the gate electrode 140c. For example, the thickness of the graphene layer 160c may be about 10 nm or less.

Figure 7:
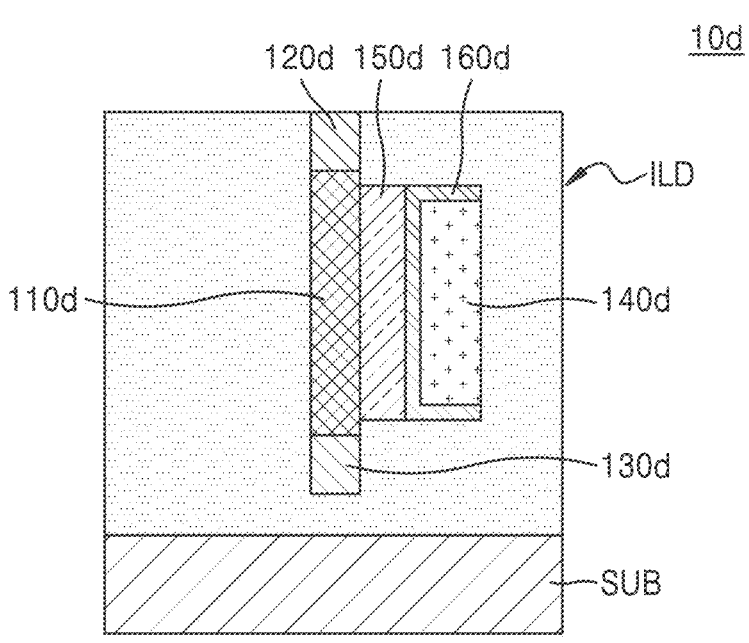
FIG. 7 is a diagram illustrating a transistor having a vertical channel structure according to various example embodiments.

FIG. 7 is a diagram illustrating a transistor 10d having a vertical channel structure according to various example embodiments. Referring to FIG. 7, an oxide semiconductor layer 110d may have a structure extending in a thickness direction of the substrate SUB. A source electrode 120d may be disposed on an upper surface of the oxide semiconductor layer 110d, and a drain electrode 130d may be disposed on a lower surface of the oxide semiconductor layer 110d. However, various example embodiments are not limited thereto. The drain electrode 130d may be disposed on the upper surface of the oxide semiconductor layer 110d and the source electrode 120d may be disposed on the lower surface of the oxide semiconductor layer 110d. A gate insulating layer 150d and a gate electrode 140d may be disposed on a side surface of the oxide semiconductor layer 110d. In addition, the metal-doped graphene layer 160*d* may be disposed between the gate insulating layer 150*d* and the gate electrode 140*d*. The metal-doped graphene layer 160*d* may cover two or more surfaces of the gate electrode 140.

Figure 8:
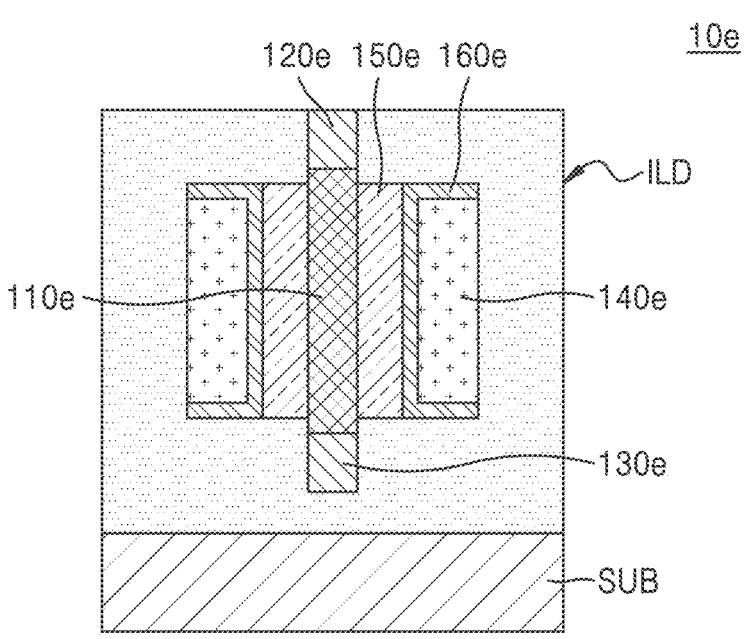
FIG. 8 is a diagram illustrating a transistor having a gate-all-around structure according to various example embodiments.

FIG. 8 is a diagram illustrating a transistor 10*e* having a gate-all-around structure according to various example embodiments. Referring to FIG. 8, an oxide semiconductor layer 110*e* may have a structure extending in a thickness direction of the substrate SUB. A source electrode 120*e* may be disposed on an upper surface of the oxide semiconductor layer 110*e* and a drain electrode 130*e* may be disposed on a lower surface of the oxide semiconductor layer 110*e*. However, various example embodiments are not limited thereto. The drain electrode 130*e* may be disposed on an upper surface of the oxide semiconductor layer 110*e* and the drain electrode 130*e* may be disposed on a lower surface of the oxide semiconductor layer 110*e*.

A gate insulating layer 150*e* covering the entire side surface of the oxide semiconductor layer 110*e* and a gate electrode 140*e* covering the side surface of the gate insulating layer 150 may be further disposed. Also, the metal-doped graphene layer 160*e* may be disposed between the gate insulating layer 150*e* and the gate electrode 140*e*. The metal-doped graphene layer 160*e* may be disposed not only on the side surface of the gate electrode 140*e* but also on the upper and lower surfaces of the gate electrode 140*e*.

So far, the source electrode and the drain electrode in contact with one surface of the oxide semiconductor layer have been described. However, various example embodiments are not limited thereto. The source electrode and the drain electrode may be in contact with a plurality of surfaces of the oxide semiconductor layer to integrate the transistor.

Figure 9:
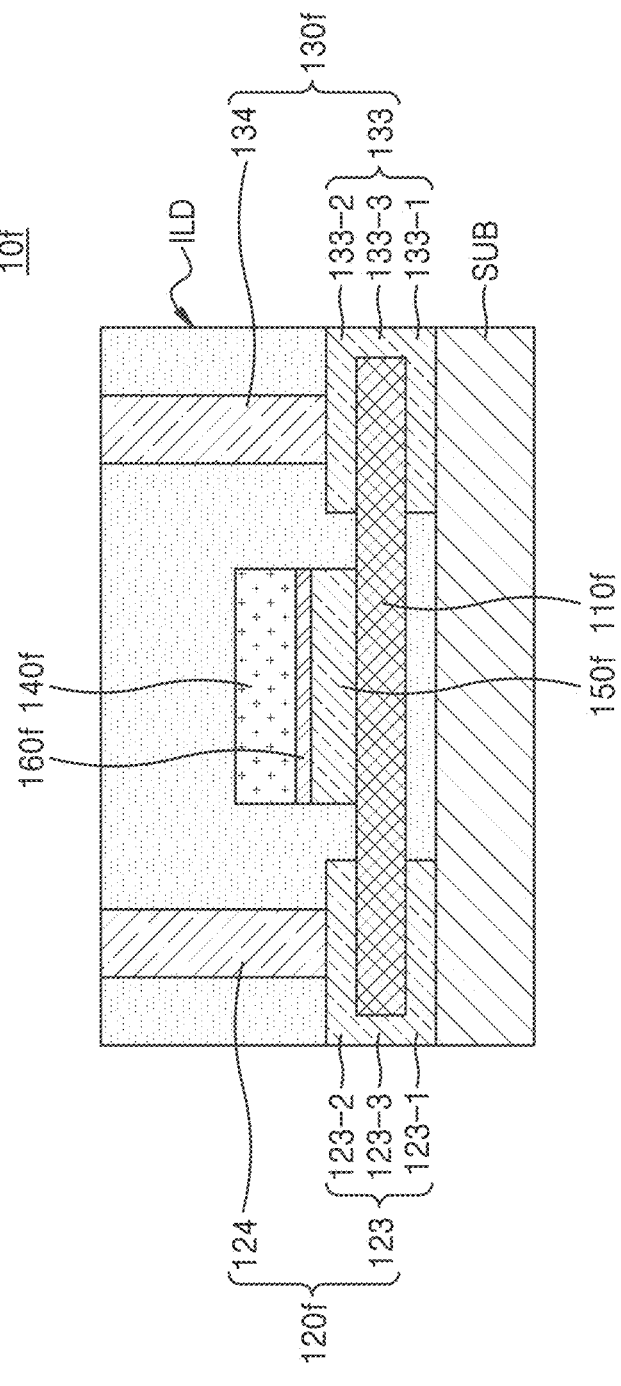
FIG. 9 is a diagram illustrating a transistor according to another embodiment.

FIG. 9 is a diagram illustrating a transistor 10*f* according to another embodiment. Referring to FIG. 9, the transistor 10*f* according to an example may include a substrate SUB, an oxide semiconductor layer 110*f* disposed on the substrate SUB, a source electrode 120*f* in contact with three or more surfaces of the oxide semiconductor layer 110*f*, a drain region 130*f* in contact with three or more surfaces of the oxide semiconductor layer 110*f*, a gate electrode 140*f* apart from the oxide semiconductor layer, and a gate insulating layer 150*f* disposed between the oxide semiconductor layer 110*f* and the gate electrode 140*f*.

The source electrode 120*f* may be disposed to contact three or more surfaces of the oxide semiconductor layer 110*f*. As an example, the source electrode 120*f* may include a first contact portion 123 in contact with the oxide semiconductor layer 110*f* and a first conductive plug 124 in contact with the first contact portion 123 and extending in one direction.

The first contact portion 123 may be disposed between the oxide semiconductor layer 110*f* and the first conductive plug 124 and may be in contact with the oxide semiconductor layer 110*f* on three or more surfaces. As described above, as a thickness h of the oxide semiconductor layer 110*f* decreases to an ultra-thin film, a thickness of an effective channel formed by a gate field may substantially be equal to a thickness of the physical oxide semiconductor layer 110*f*. A difference in charge concentration between a lower surface and an upper surface of the oxide semiconductor layer 110*f* is also reduced, so that a contact area in which the entire area of the oxide semiconductor layer 110*f* is in contact with the source electrode 120*f* and the drain region 130*f* may be formed.

As an example, when the oxide semiconductor layer 110*f* is provided in the form of a thin film extending along one plane, the first contact portion 123 may include a first lower contact layer 123-1 surrounding a portion of the lower surface of the oxide semiconductor layer 110*f*, a first upper contact layer 123-2 surrounding a portion of the upper surface of the oxide semiconductor layer 110*f*, and a first side contact layer 123-3 surrounding one side surface of the oxide semiconductor layer 110*f*. The first lower contact layer 123-1 may be disposed to face the substrate SUB. The first upper contact layer 123-2 may be disposed to face the first lower contact layer 123-1 with the oxide semiconductor layer 110*f* interposed therebetween. As an example, the first upper contact layer 123-2 may be provided to contact one end of the first conductive plug 124. The first side contact layer 123-3 may be disposed between the first lower contact layer 123-1 and the first upper contact layer 123-2 to connect the first lower contact layer 123-1 to the first upper contact layer 123-2.

Like the source electrode 120*f*, the drain electrode 130*f* may also contact three or more surfaces of the oxide semiconductor layer 110*f*. As an example, the drain electrode 130*f* may include a second contact portion 133 in contact with the oxide semiconductor layer 110*f* and a second conductive plug 134 in contact with the second contact portion 133 and extending in one direction.

The second contact portion 133 may be disposed between the oxide semiconductor layer 110*f* and the second conductive plug 134 and may contact the oxide semiconductor layer 110*f* on three or more surfaces. As described above, as the thickness of the oxide semiconductor layer 110*f* decreases to an ultra-thin film, a thickness of an effective channel formed by a gate field may substantially be equal to the thickness of the physical oxide semiconductor layer 110*f*. A difference in charge concentration between a lower surface and an upper surface of the oxide semiconductor layer 110*f* is also reduced, so that a contact area in which the lower surface and the upper surface of the oxide semiconductor layer 110*f* are in contact with the drain electrode 130*f* and the drain region 130*f* may be formed.

As an example, when the oxide semiconductor layer 110*f* is provided in the form of a thin film extending along one plane, the second contact portion 133 may include a second lower contact layer 133-1 surrounding a portion of the lower surface of the oxide semiconductor layer 110*f*, a second upper contact layer 133-2 surrounding a portion of the upper surface of the oxide semiconductor layer 110*f*, and a second side contact layer 133-3 surrounding one side of the oxide semiconductor layer 110*f*. The second lower contact layer 133-1 may be disposed to face the substrate SUB. The second upper contact layer 133-2 may be disposed to face the second lower contact layer 133-1 with the oxide semiconductor layer 110*f* interposed therebetween. As an example, the second upper contact layer 133-2 may be provided to contact one end of the second conductive plug 134. The second side contact layer 133-3 may be disposed between the second lower contact layer 133-1 and the second upper contact layer 133-2 to connect the second lower contact layer 133-1 to the second upper contact layer 133-1.

The transistor 10*f* may further include a metal-doped graphene layer 160*f* between the gate electrode 140*f* and the gate insulating layer 150*f*.

A metal doped in the graphene layer 160*f* may be different from a metal included in the oxide semiconductor layer 110*f*. For example, the metal doped in the graphene layer 160*f* may include at least one of ruthenium (Ru), aluminum (Al), titanium (Ti), thallium (Ti), platinum (Pt), tantalum (Ta), rhodium (Rh), iridium (Ir), cobalt (Co), and tungsten (W), and the oxide semiconductor layer 110*f* may be an oxide including at least one of In, Zn, Sn, Ga, and Hf. The metal may be doped in an amount of 0.2 at % or more, 0.5 at % or more, 2 at % or more, 3 at % or more, 4 at % or less, or 5 at % or less with respect to a total amount of the graphene layer 160f, and a thickness of the doped graphene layer 160f is less than a thickness of the gate electrode 140f. For example, the thickness of the graphene layer 160f may be about 10 nm or less.

Figure 10:
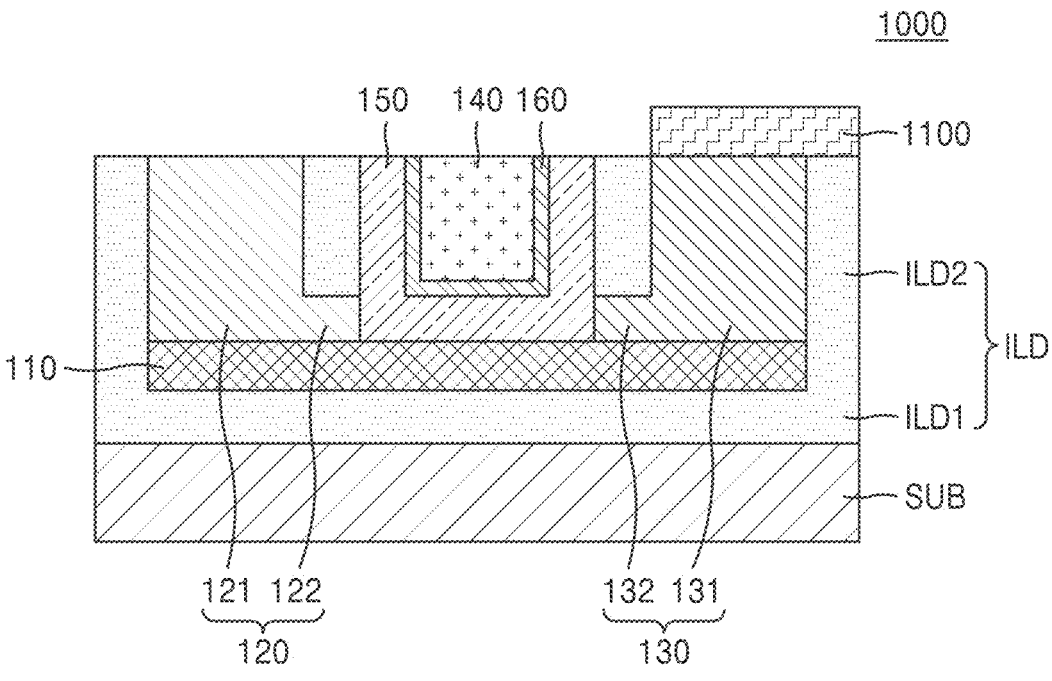
FIG. 10 shows a memory device including the aforementioned transistor as a switching element and a data storage device connected to the switching element.

FIG. 10 shows a memory device 1000 using the aforementioned transistor as a switching element and including a data storage element connected to the switching element. In an example, the transistor 100 of FIG. 1, among the transistors described above, may be used as a switching element.

Referring to FIG. 10, the memory device 1000 includes a data storage element 1100 on the interlayer insulating layer ILD. The data storage element 1100 may cover the entire upper surface of the drain electrode 130 and may be in direct contact with the upper surface. The data storage element 1100 may include a capacitor, a ferroelectric capacitor, and a magnetic tunnel junction (MTJ) cell. The memory device 1000 may be a volatile memory device, such as DRAM, or a nonvolatile memory device, such as FRAM, MRAM, ReRAM, or the like, depending on the data storage element 1100.

Figure 11:
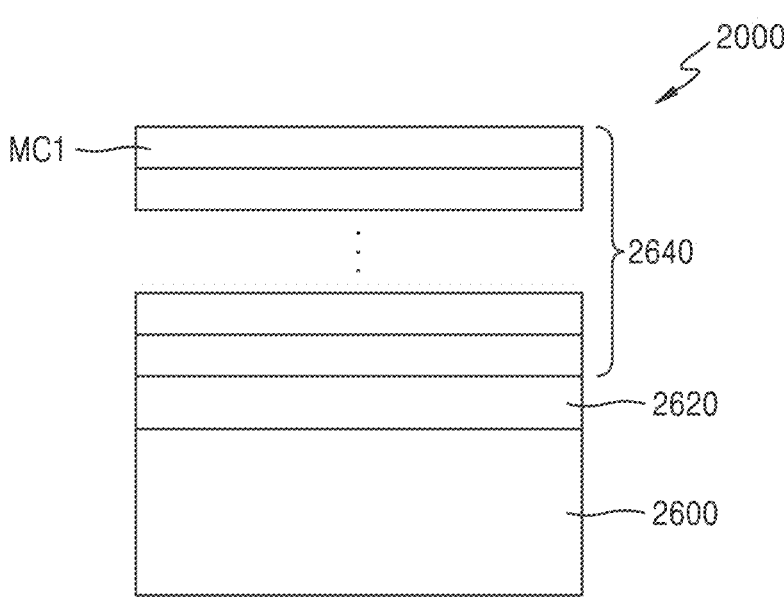
FIG. 11 illustrates a memory device in which a plurality of memory devices of FIG. 10 are vertically stacked.

FIG. 11 illustrates a memory device 2000 in which a plurality of memory cells MC1 of FIG. 10 are vertically stacked.

Referring to FIG. 11, a memory logic layer 2620 controlling an operation of the memory device 2000 is disposed on a substrate 2600, and a memory cell array 2640 is provided on the memory logic layer 2620. The memory cell array 2640 includes a plurality of vertically stacked memory cells MC1. In an example, the memory cell MC1 may be the memory device 1000 of FIG. 10.

In the above, the transistor including a metal-doped graphene layer has been illustrated and described, but various example embodiments are not limited to the specific exemplary embodiments described above, and may be variously modified by those skilled in the art to which the present invention pertains without departing from the scope and spirit of the present invention as claimed in the claims and these modifications should also be understood to fall within the technical spirit and scope of various example embodiments.

According to various example embodiments, a threshold voltage of a transistor may be increased by adding a graphene layer doped with a metal having a large work function.

The metal-doped graphene layer may serve as a barrier to improve the reliability of driving of the transistor.

However, the effect of various example embodiments are not limited to the above disclosure.

It should be understood that various example embodiments described herein should be considered in a descriptive sense only and not for purposes of limitation. Descriptions of features or aspects within each embodiment should typically be considered as available for other similar features or aspects in other example embodiments, and embodiments are not necessarily mutually exclusive. While one or more embodiments have been described with reference to the figures, it will be understood by those of ordinary skill in the art that various changes in form and details may be made therein without departing from the spirit and scope as defined by the following claims.

What is claimed is:

1. A transistor comprising:
an oxide semiconductor layer;
a source electrode and a drain electrode spaced apart from each other on the oxide semiconductor layer;
a gate electrode spaced apart from the oxide semiconductor layer;
a gate insulating layer between the oxide semiconductor layer and the gate electrode; and
a graphene layer between the gate electrode and the gate insulating layer and doped with a metal.

2. The transistor of claim 1, wherein the metal doped in the graphene layer is different from a metal included in the oxide semiconductor layer.

3. The transistor of claim 1, wherein the metal doped into the graphene layer includes at least one of ruthenium (Ru), aluminum (Al), titanium (Ti), platinum (Pt), thallium (Tl), tantalum (Ta), rhodium (Rh), iridium (Ir), cobalt (Co), and tungsten (W).

4. The transistor of claim 1, wherein the metal is doped into the graphene layer in an amount of 0.2 at % or more and 5 at % or less with respect to a total amount of the graphene layer.

5. The transistor of claim 1, wherein a work function of the graphene layer is greater or equal to 4.9 eV or and less than or equal to 5.1 eV.

6. The transistor of claim 1, wherein a threshold voltage of the transistor is positive when a current flowing from the drain electrode to the source electrode is about $10^{-12}$ A/micron.

7. The transistor of claim 1, wherein a thickness of the graphene layer is less than a thickness of the gate electrode.

8. The transistor of claim 1, wherein a thickness of the graphene layer is less than or equal to 10 nm.

9. The transistor of claim 1, wherein the graphene layer is in contact with two or more surfaces of the gate electrode.

10. The transistor of claim 1, wherein the graphene layer is in contact with a lower surface of the gate electrode and a side surface of the gate electrode.

11. The transistor of claim 1, wherein the gate insulating layer at least partially covers two or more surfaces of the gate electrode.

12. The transistor of claim 1, wherein the gate insulating layer at least partially covers a lower surface of the gate electrode and a side surface of the gate electrode.

13. The transistor of claim 1, wherein the gate insulating layer is in contact with at least one of the source electrode and the drain electrode.

14. The transistor of claim 1, wherein at least one of the source electrode and the drain electrode includes a stepped shape.

15. The transistor of claim 1, wherein at least one of the source electrode and the drain electrode includes a first region having a first thickness and a second region having a second thickness less than the first thickness, and the second region is closer to the gate electrode than the first region.

16. The transistor of claim 1, wherein the source electrode, the drain electrode, and the gate insulating layer are in contact with a same surface of the oxide semiconductor layer.

17. The transistor of claim 1, wherein the source electrode and the drain electrode are on a first surface of the oxide semiconductor layer, and the gate insulating layer is on a second surface, different from the first surface of the oxide semiconductor layer.

18. The transistor of claim 1, wherein the gate insulating layer includes a first gate insulating layer in contact with a first surface of the oxide semiconductor layer and a second gate insulating layer in contact with a second surface different from the first surface of the oxide semiconductor layer, the gate electrode includes a first gate electrode on the first gate insulating layer and a second gate electrode on the second gate insulating layer, and the graphene layer includes a first graphene layer between the first gate insulating layer and the first gate electrode and a second graphene layer between the second gate insulating layer and the second gate electrode.

19. The transistor of claim 1, wherein the source electrode, the oxide semiconductor layer, and the drain electrode are sequentially arranged in one direction.

20. The transistor of claim 1, wherein the gate insulating layer entirely surrounds a side surface of the oxide semiconductor layer.

* * * * *